United States Patent
Su et al.

(10) Patent No.: US 7,839,150 B2
(45) Date of Patent: Nov. 23, 2010

(54) DETECTING DEVICE FOR DETECTING ELECTRICAL CONNECTION BETWEEN PADS OF A PACKAGE SUBSTRATE

(75) Inventors: Heng-Lung Su, Kaohsiung (TW); Wen-Shian Huang, Kaohsiung (TW); Sheng-Feng Tseng, Kaohsiung (TW); Feng-Chen Cheng, Kaohsiung (TW); Chang-Shuo Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 437 days.

(21) Appl. No.: 11/979,989

(22) Filed: Nov. 13, 2007

(65) Prior Publication Data

US 2008/0252300 A1    Oct. 16, 2008

(30) Foreign Application Priority Data

Apr. 12, 2007   (TW) .............................. 96112941 A

(51) Int. Cl.
*G01R 31/02* (2006.01)
(52) U.S. Cl. ....................................... 324/537; 324/754
(58) Field of Classification Search ................. 324/537, 324/754
See application file for complete search history.

(56) References Cited

U.S. PATENT DOCUMENTS

| 5,909,124 A | * | 6/1999 | Madine et al. | 324/761 |
| 6,492,825 B2 | * | 12/2002 | Choi | 324/755 |
| 6,774,662 B2 | * | 8/2004 | Co et al. | 324/765 |

* cited by examiner

*Primary Examiner*—Amy He
(74) *Attorney, Agent, or Firm*—Bacon & Thomas, PLLC

(57) ABSTRACT

A detecting device for detecting the electrical connection between several first pads and second pads of a package substrate is provided. The first and the second pads are disposed on two opposite sides of the package substrate. The detecting device includes a socket unit, several first detecting components and several second detecting components. The socket unit is disposed on and coupled to the first pads. The first detecting components are disposed on and coupled to the socket unit. The second detecting components are disposed under and coupled to the second pads. The socket unit and the second detecting components are disposed on two opposite sides of the package substrate. While detecting, the first detecting components, the socket unit, the first pads, the second pads and the second detecting components are electrically connected sequentially, so as to determine whether the first pads are respectively and electrically connected to the second pads.

20 Claims, 5 Drawing Sheets

US 7,839,150 B2

DETECTING DEVICE FOR DETECTING ELECTRICAL CONNECTION BETWEEN PADS OF A PACKAGE SUBSTRATE

This application claims the benefit of Taiwan application Serial No. 096112941, filed Apr. 12, 2007, the subject matter of which is incorporated herein by reference.

BACKGROUND OF THE INVENTION

1. Field of the Invention

The invention relates in general to a detecting device, and more particularly to a detecting device for detecting a package substrate.

2. Description of the Related Art

Please refer to both FIG. 1A and FIG. 1B. FIG. 1A and FIG. 1B are perspectives of a conventional detecting device detecting different package substrates. Conventional detecting device 100 includes several top probes 120 and several bottom probes 130, wherein the top probes 120 and the bottom probes 130 are used for detecting a package substrate 110. The package substrate 110 includes several top pads 112 and several bottom pads 114, wherein the top pads 112 and the bottom pads 114 are electrical connection via several traces 116. The top probes 120 are disposed opposite to the top pads 112 of the package substrate 110, and the bottom probes 130 are disposed opposite to the bottom pads 114 of the package substrate 110.

The detecting device 100 electrically conducts through the top probes 120, the substrate 110 and the bottom probes 130 to detect the substrate 110 whereby the top probes 120 are coupled to the top pads 112 and the bottom probes 130 are coupled to the bottom pads 114, so as to determine whether each of the top pads 112 is electrical connection to each of the bottom pad 114 via a corresponding trace 116. While detecting the package substrate 110' (as indicated in FIG. 1B) whose densities of the top pads 112' and the bottom pads 114' are different than others, the detecting device 100 matching up the package substrate 110' requires replacing the top probes 120' and the bottom probes 130' as indicated in FIG. 1B. As a result, the commonality and convenience of the detecting device 100 is limited, and the detection cost is increased.

SUMMARY OF THE INVENTION

The invention is directed to a detecting device. By using a socket component, the detecting device is capable of detecting the top and bottom pads of the package substrates with different densities, hence increasing commonality of the detecting device and reducing detection cost.

According to a first aspect of the present invention, a detecting device for detecting the electrical connection between several first pads and second pads of a package substrate is provided. The first pads and the second pads are disposed on two opposite sides of the package substrate. The detecting device includes a socket unit, several first detecting components and several second detecting components. The socket unit is disposed on and coupled to the first pads. The first detecting components are disposed on and coupled to the socket unit. The second detecting components are disposed under and coupled to the second pads. The socket unit and the second detecting components are disposed on two opposite sides of the package substrate. While detecting, the first detecting components, the socket unit, the first pads, the second pads and the second detecting components are electrically connected sequentially, so as to determine whether the first pads are respectively and electrically connected to the second pads.

According to a second aspect of the present invention, a detecting device for detecting the electrical connection between several first pads and several second pads of a package substrate is provided. The first pads and the second pads are disposed on two opposite sides of the package substrate. The detecting device includes a first socket unit, several first detecting components, a second socket unit and several second detecting components. The first socket unit is disposed on and coupled to the first pads. The first detecting components are disposed on and coupled to the first socket unit. The first detecting components and the package substrate are disposed on two opposite sides of the first socket unit. The second socket unit is disposed under the second pads and coupled to the second pads. The second detecting components are disposed under and coupled to the second socket unit. The second detecting components and the package substrate are disposed on two opposite sides of the second socket unit. While detecting, the first detecting components, the first socket unit, the first pads, the second pads, the second socket unit and the second detecting components are electrically connected sequentially, so as to determine whether the first pads are respectively and electrically connected to the second pads.

The invention will become apparent from the following detailed description of the preferred but non-limiting embodiments. The following description is made with reference to the accompanying drawings.

DETAILED DESCRIPTION OF THE INVENTION

A detecting device for detecting a package substrate by way of electrical connection is provided in the invention. The detecting device is coupled to the package substrate via a socket unit. The different package substrates via the same socket unit are capable of transferring the path of electrical connection, hence increasing the commonality of the detecting device. Detecting devices with different internal structures are described in different embodiments.

First Embodiment

Figure 1A:
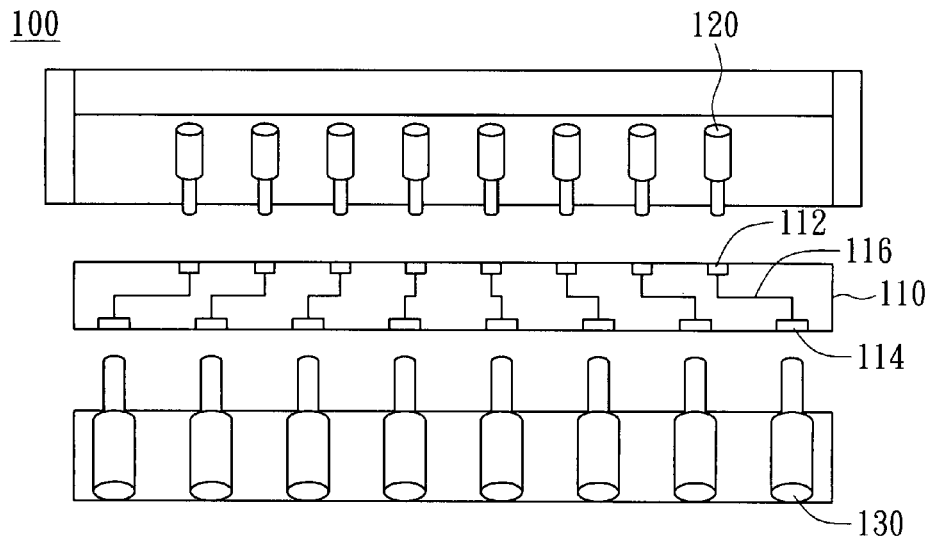
FIGS. 1A and 1B (Prior Arts) are perspectives of a conventional detecting device detecting different package substrates.
Figure 1B:
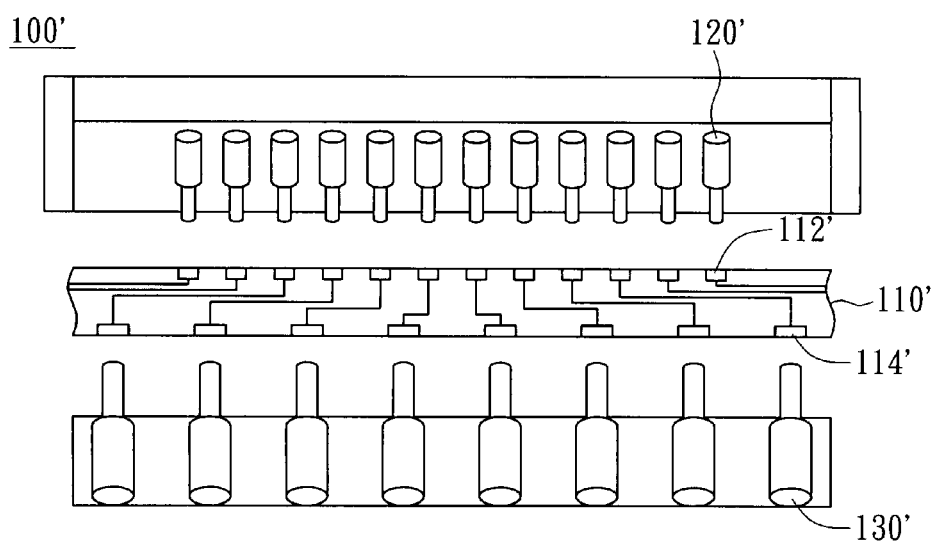
Figure 2:
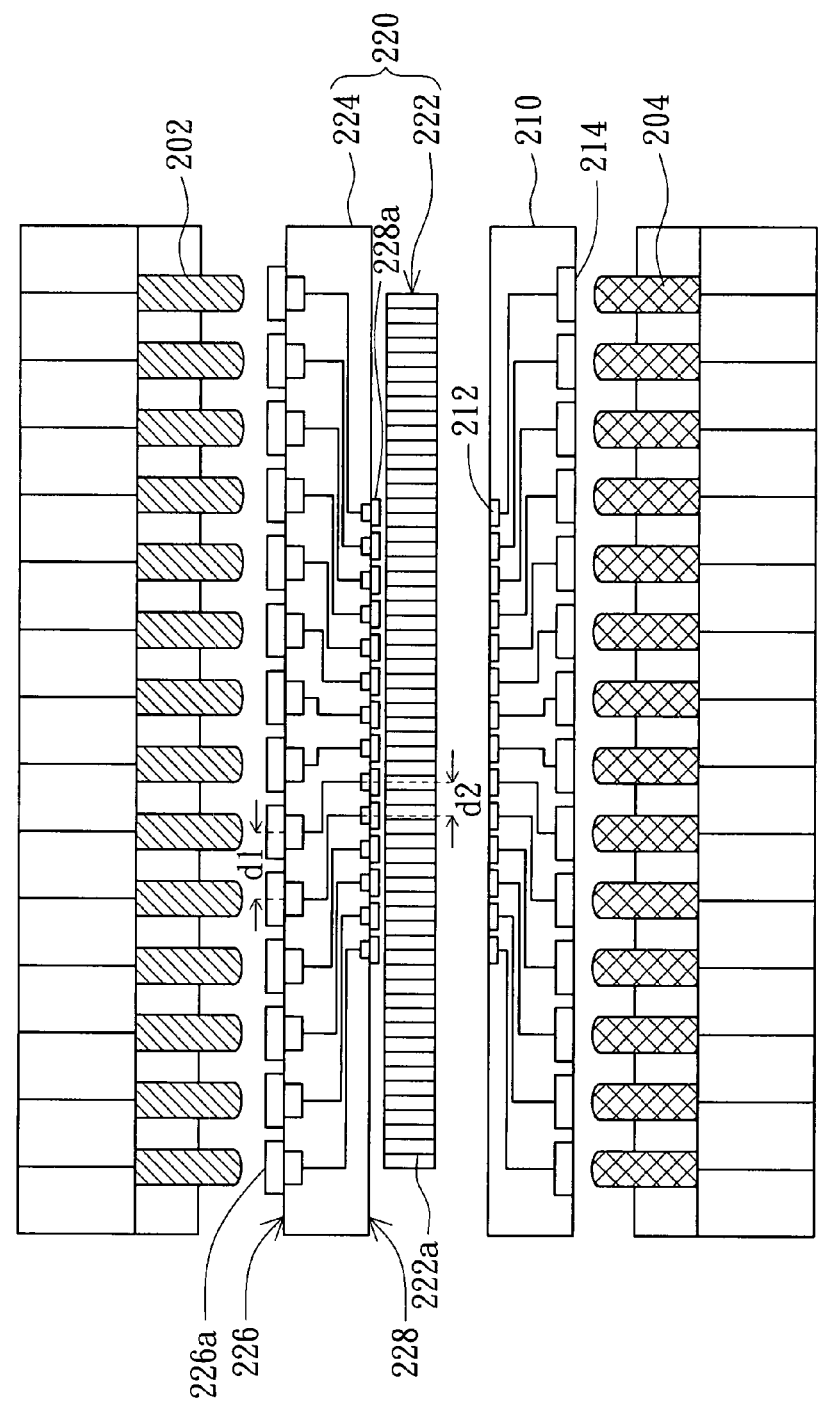
FIG. 2 is a perspective of a detecting device and a package substrate according to a first embodiment of the invention.

Please refer to FIG. 2. FIG. 2 is a perspective of a detecting device and a package substrate according to a first embodiment of the invention. The detecting device 200 is used for detecting the electrical connection between several first pads 212 and several second pads 214 of a package substrate 210, wherein the first pads 212 and the second pads 214 are disposed on two opposite sides of the package substrate 210. The detecting device 200 includes a socket unit 220, several first detecting components 202 and several second detecting components 204. The socket unit 220 is disposed on and coupled to the first pads 212.

Furthermore, the socket unit 220 includes a conductive piece 222 and a socket component 224. The conductive piece 222 is coupled to the first pads 212 of the package substrate 210. The socket component 224 is disposed between and coupled to the conductive piece 222 and several first detecting components 202. The second detecting components 204 are disposed under and coupled to the second pads 214 of the package substrate 210. The socket unit 220 and the second detecting components 204 are disposed on two opposite sides of the package substrate 210. While detecting, the first detecting components 202, the socket component 224, the conductive piece 222, the first pads 212, the second pads 214 and the second detecting components 204 are electrically connected sequentially, so as to determine whether the first pads 212 are respectively and electrically connected to the second pads 214.

Figure 3A:
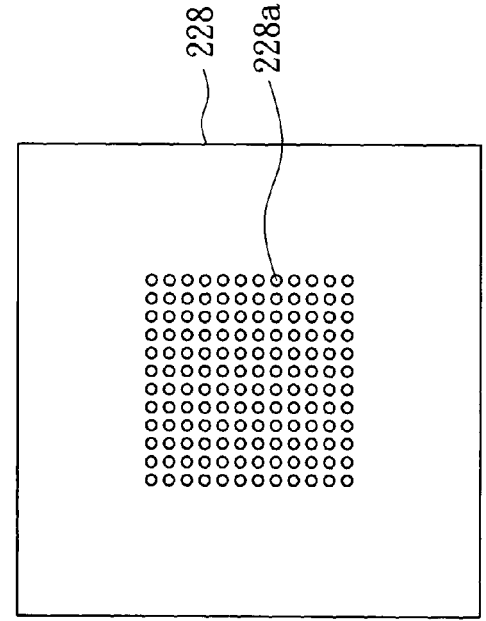
FIG. 3A is a top view of a socket component of FIG. 2.
Figure 3B:
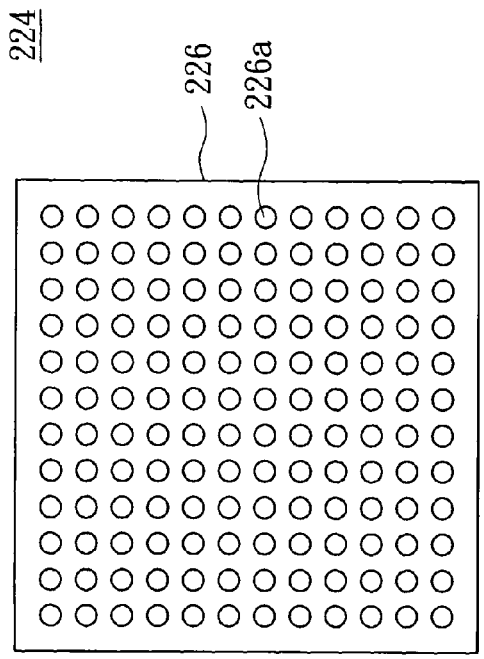
FIG. 3B is a bottom view of a socket component of FIG. 2.
Figure 3C:
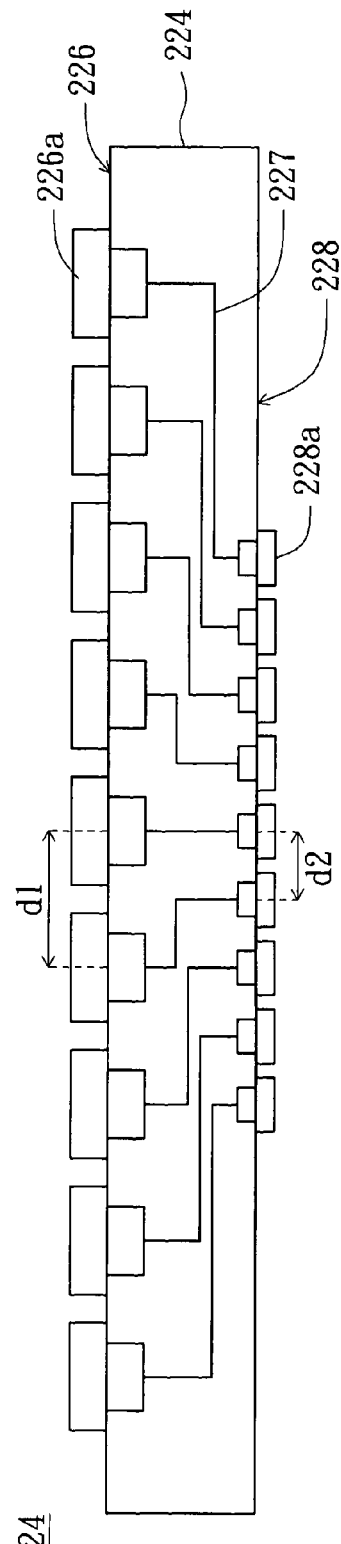
FIG. 3C is a cross-sectional view of a socket component of FIG. 2.

Please refer to FIGS. 3A~3C. FIG. 3A is a top view of the socket component of FIG. 2. FIG. 3B is a bottom view of the socket component of FIG. 2. FIG. 3C is a cross-sectional view of the socket component of FIG. 2. In the present embodiment, the socket component 224 such as a package substrate whose top surface and bottom surface respectively have several electrical pads, wherein the electrical pads disposed on the top surface electrically connected to corresponding electrical pads disposed on the bottom surface. The socket component 224 has a first transition surface 226 and a second transition surface 228. The first transition surface 226 has several first transition points 226a, and the second transition surface 228 has several second transition points 228a. Each of the first transition points 226a electrically connected to the corresponding second transition point 228a via a trace 227. The first transition points 226a of the socket component 224 are spaced at a first distance d1, and the second transition points 228a are spaced at a second distance d2, wherein the second distance d2 is smaller than the first distance d1. The different package substrates being detected via the socket component 224 through the second distance d2 is capable of transferring electrical connection. Otherwise, the second distance d2 could be larger than or equal to the first distance d1.

Please refer to FIG. 2 again. The conductive piece 222 includes several needles 222a. The needles 222a substantially parallel to dispose each other. In the present embodiment of the invention, cross-sectional area of the silk-like metallic wires is far smaller than that of the first pads 212 of the package substrate 210 are exemplified as the needles 222a. The number of the needles 222a is substantially much larger than that of the first pads 212. Each of the first pads 212 is substantially coupled to more than one needle 222a individually, and each of the second transition points 228a is substantially coupled to more than one needle 222a individually. The needles 222a are tiny and have high distributing density, such that the first pads 212 are electrically connected to the second transition points 228a via the needles 222a, thereby connecting the detecting circuit of the package substrate 210 to the first detecting components 202. As different package substrates 210 with pads distributed in different densities, the first transition points 226a of the socket component 224 are preferably disposed towards the first detecting components 202 and the second transition point 228a are preferably disposed towards the first pads 212, and the socket component 224 is used corresponding the package substrate 210.

In the present embodiment of the invention, several probes are exemplified as the first detecting components 202 and the second detecting components 204. Each first detecting component 202 is electrically connected to a first pad 212 via the socket unit 220 individually, and each second detecting component 204 is electrically connected to a second pad 214 individually. While detecting, the first detecting components 202, the socket component 224, the conductive piece 222, the first pads 212, the second pads 214 and the second detecting components 204 are sequentially connected so as to determine whether the first pads 212 are respectively and electrically connected to the second pads 214 and assure the quality of the package substrate 210.

According to the detecting device 200 disclosed in the first embodiment of the invention, the socket unit 220 connects the pads with different densities so that different package substrates 210 are applicable to the same detecting device 200, not only effective increasing the commonality of the detecting device 200 but also reducing the detecting cost and the manufacturing cost of the package substrate 210.

Second Embodiment

Figure 4:
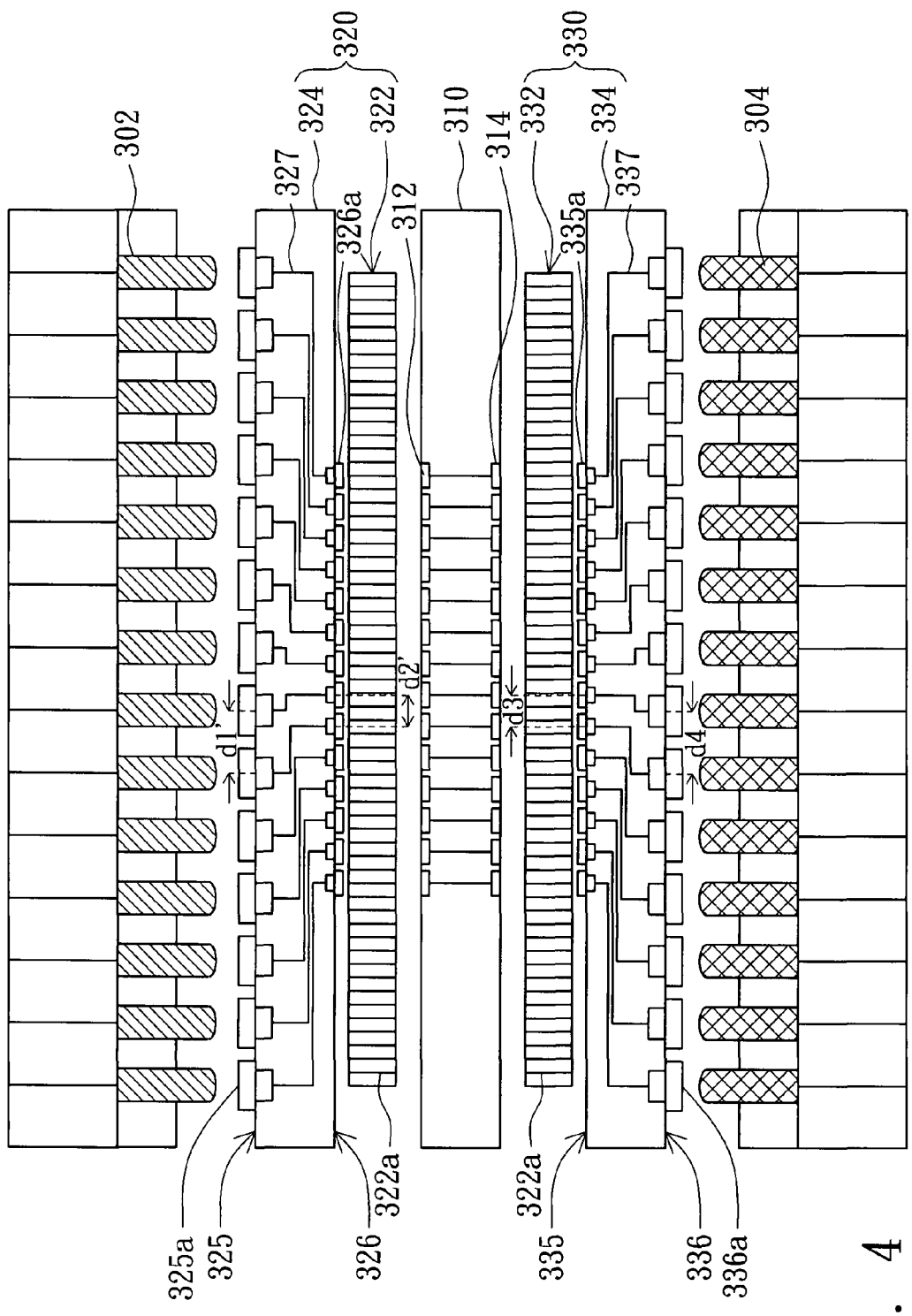
FIG. 4 is a perspective of a detecting device and a package substrate according to a second embodiment of the invention.

Please refer to FIG. 4. FIG. 4 is a perspective of a detecting device and a package substrate according to a second embodiment of the invention. In the second embodiment and the first embodiment, both the electrical circuit are detected via a socket component, the difference lies in the disposition between the socket unit and the package substrate. In the first embodiment, the socket component of the detecting device 200 is used in a single-sided pad of the package substrate as indicated in FIG. 2. In the present embodiment of the invention, the socket component of the detecting device 300 is used in the electrical connection of the double-sided pad of the package substrate.

The detecting device 300 is used for detecting the electrical connection between several first pads 312 and several second pads 314 of a package substrate 310, wherein the first pads 312 and the second pads 314 are disposed on two opposite sides of the package substrate 310. The detecting device 300 includes a first socket unit 320, a second socket unit 330, several first detecting components 302 and several second detecting components 304. The first socket unit 320 is disposed on and coupled to the first pads 312. The first detecting components 302 are disposed on and coupled to the first socket unit 320. The first detecting components 302 and the package substrate 310 are disposed on two opposite sides of the first socket unit 320. The second socket unit 330 is disposed under the second pads 314 and coupled between the second pads 314 and the second detecting components 304. The second detecting components 304 is disposed under and coupled to the second socket unit 330. The second detecting components 304 and the package substrate 310 are disposed on two opposite sides of the second socket unit 330.

Furthermore, the first socket unit 320 includes a first conductive piece 322 and a first socket component 324. The first conductive piece 322 is coupled to the first pads 312 of the package substrate 310. The first socket component 324 is disposed between the first conductive piece 322 and several first detecting components 302, and is coupled to the first conductive piece 322 and the first detecting components 302. The second socket unit 330 includes a second conductive piece 332 and a second socket component 334. The second conductive piece 332 is coupled to the second pads 314 of the package substrate 310. The second socket component 334 is disposed between the second conductive piece 332 and several second detecting components 304, and coupled to the second conductive piece 332 and the second detecting components 304. While detecting, the first detecting components 302, the first socket component 324, the first conductive piece 322, the first pads 312, the second pads 314, the second conductive piece 332, the second socket component 334 and the second detecting components 304 are electrically connected sequentially, so as to determine whether the first pads 312 are respectively and electrically connected to the second pads 314.

In the present embodiment of the invention, the first socket component 324 and the second socket component 334 are respectively exemplified as a package substrate. There are several electrical pads disposed on the top surface and bottom surface of each of the package substrate, and the electrical pads disposed on the top surface are corresponding to and electrically connected to the electrical pads disposed on the bottom surface. The first socket component 324 has a first transition surface 325 and a second transition surface 326. The first transition surface 325 has several first transition points 325a. The second transition surface 326 has several second transition points 326a. Each of the first transition points 325a is electrically connected to each of the second transition point 326a respectively via a first trace 327. The first transition points 325a of the first socket component 324 are disposed correspond to the first detecting components 302, and the second transition points 326a of the first socket component 324 are disposed correspond to the first pads 312 of the package substrate 310. The third transition points 335a of the second socket component 334 are disposed correspond to the second pads 314 of the package substrate 310. The fourth transition points 336a of the second socket component 334 are disposed correspond to the second detecting components 304. The first transition points 325a of the first socket component 324 are spaced at a first distance d1', and the second transition points 326a are spaced at a second distance d2', wherein the second distance d2' is smaller than the first distance d1'. The second socket component 334 has a third transition surface 335 and a fourth transition surface 336. The third transition surface 335 has several third transition points 335a. The fourth transition surface 336 has several fourth transition points 336a. Each of the third transition points 335a is respectively and electrically connected to a fourth transition point 336a via a second trace 337. The third transition points 335a of the socket component 334 are spaced at a third distance d3, and the fourth transition points 336a are spaced at a fourth distance d4, wherein the third distance d3 is smaller than the fourth distance d4. In the present embodiment of the invention, the second distance d2' and the third distance d3 are respectively smaller than the first distance d1' and the fourth distance d4. While detecting the package substrate, the first socket component 324 and the second socket component 334 are selected according to the densities of the pads of the package substrate being detected, so as to change the first distance d1', the second distance d2', the third distance d3 and the fourth distance d4. Otherwise, the second distance d2' and the third distance d3 could be larger than or equal to the first distance d1' and the fourth distance d4.

On the other hand, the first conductive piece 322 includes several first needles 322a. The first needles 322a substantially parallel to dispose each other. The first needles 322a are silk-like metallic wires. The cross-sectional area of the first needles 322a is far smaller than that of the first pads 312 of the package substrate 310, and the number of the first needles 322a is substantially larger than that of the first pads 312. Each of the first pads 312 is substantially coupled to more than one first needle 322a individually. Each of the second transition points 326a is substantially corresponding to and coupled to more than one first needle 322a. The second conductive piece 332 includes several second needles 332a. The second needles 332a substantially parallel to dispose each other. The second needles 332a are silk-like metallic wires. The cross-sectional area of the second needles 332a is far smaller than that of the second pads 314 of the package substrate 310, and the number of the second needles 332a is substantially larger than that of the second pads 314. Each of the second pads 314 is substantially coupled to more than one second needle 332a individually. Each of the third transition points 335a is substantially coupled to more than one second needle 332a individually.

In the present embodiment of the invention, the first detecting components 302 and second detecting components 304 are exemplified as several probes. While the detecting device 300 is detecting, each of the first detecting components 302 is corresponding to and electrically connected to a first pad 312 via the first socket unit 320, and each of the second detecting components 304 is corresponding to and electrically connected to a second pad 314. When the first detecting components 302, the first socket component 324, the first conductive piece 322, the first pads 312, the second pads 314, the second conductive piece 332, the second socket component 334 and the second detecting components 304 are electrically connected sequentially, whether the first pads 312 are respectively and electrically connected to the second pads 314 is determined.

Third Embodiment

Figure 5:
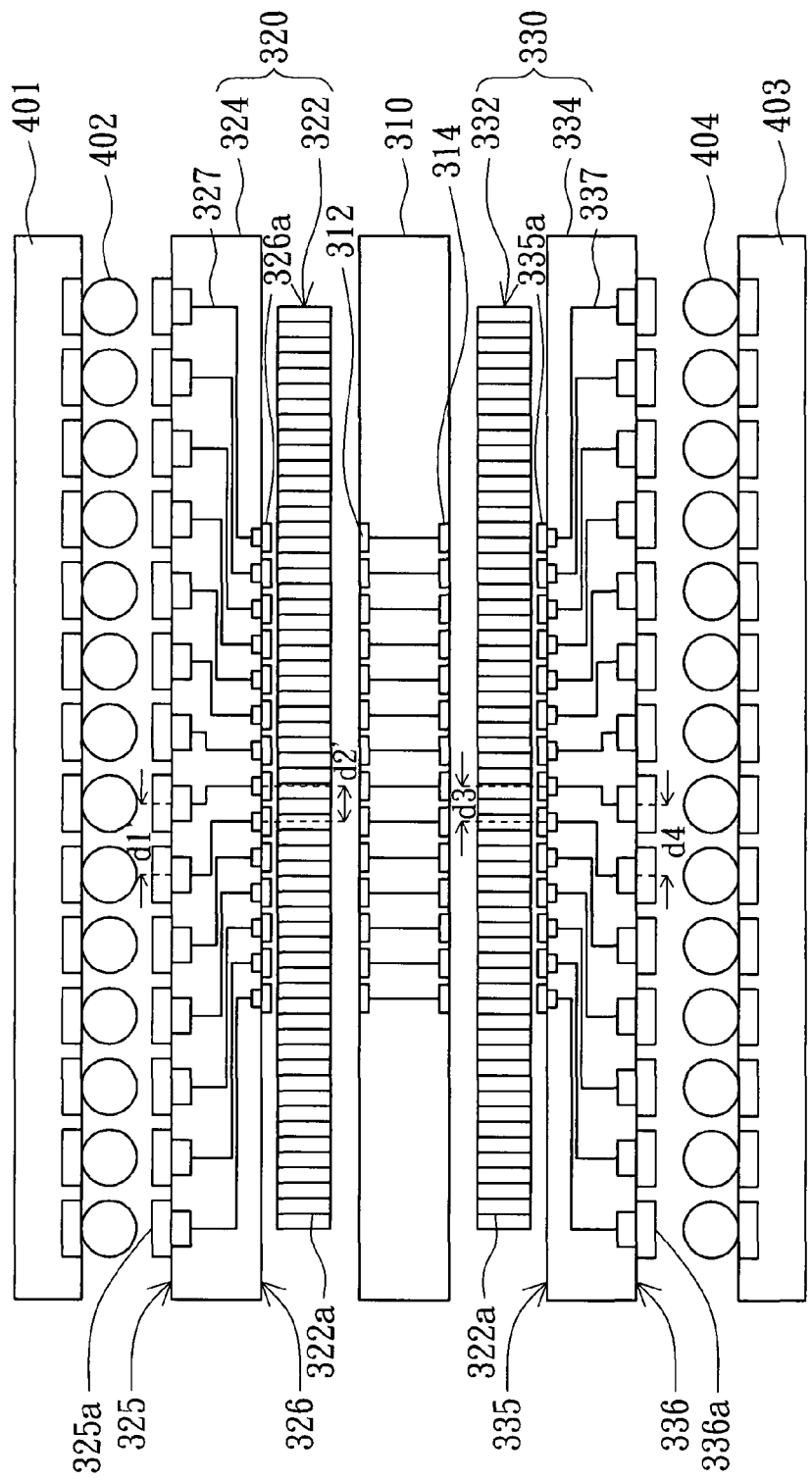
FIG. 5 is a perspective of a detecting device and a package substrate according to a third embodiment of the invention.

The present embodiment differs with the second embodiment in the electrical connection between the first detecting components and the second detecting components, and other similarities are not repeated here. Please refer to FIG. 5. FIG. 5 is a perspective of a detecting device and a package substrate according to a third embodiment of the invention. The detecting device 400 includes a first printed circuit board 401 and a second printed circuit board 403. The first printed circuit board 401 is coupled to the first detecting components 402, and the second printed circuit board 403 is coupled to the second detecting components 404. In the present embodiment of the invention, the first detecting components 402 are exemplified as several solder balls soldered on the first printed circuit board 401, and the second detecting components 404 are also several exemplified as solder balls soldered on the second printed circuit board 403. When the detecting device 400 is detecting, each of the first detecting components 402 is corresponding to and electrically connected to a first pad 312 via the first socket unit 320, and each of the second detecting components 404 is corresponding to and electrically connected to a second pad 314. When the first printed circuit board 401, the first detecting components 402, the first socket component 324, the first conductive piece 322, the first pads 312, the second pads 314, the second conductive piece 332, the second socket component 334, the second detecting components 404 and the second printed circuit board 403 are electrically connected sequentially, whether the first pads 312 are respectively and electrically connected to the second pads 314 is determined.

According to the detecting device disclosed in the above preferred embodiments of the invention, the conductive circuits between the pads are increased by way of several tiny needles inside the conductive piece and by way of connecting the circuits to different pads via the socket component. As a result, there isn't required to change the detecting components of the detecting device when detecting the package substrate whose pads having different densities, not only effectively increasing the commonality of the detecting device but also reducing the replacement frequency and manufacturing cost of the detecting device.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A detecting device for detecting the electrical connection between a plurality of first pads and second pads of a package substrate, wherein the first pads and the second pads are disposed on two opposite sides of the package substrate, comprising:
    a socket unit, disposed on and coupled to the first pads;
    a plurality of first detecting components, disposed on and coupled to the socket unit; and
    a plurality of second detecting components, disposed under and coupled to the second pads, wherein the socket unit and the second detecting components are disposed on two opposite sides of the package substrate;
    wherein while detecting, the first detecting components, the socket unit, the first pads, the second pads and the second detecting components are electrically connected sequentially, so as to determine whether the first pads are respectively and electrically connected to the second pads.

2. The detecting device according to claim 1, wherein the socket unit comprises:
    a conductive piece, coupled to the first pads; and
    a socket component, having a first transition surface and a second transition surface;
    wherein the first transition surface is coupled to the first detecting components, and the second transition surface is coupled to the conductive piece.

3. The detecting device according to claim 2, wherein the first transition surface has a plurality of first transition points disposed towards the first detecting components, and the second transition surface has a plurality of second transition points disposed towards the first pads.

4. The detecting device according to claim 3, wherein the first transition points are respectively and electrically connected to the second transition points.

5. The detecting device according to claim 3, wherein the conductive piece comprises:
    a plurality of needles, disposed substantially parallel to each other.

6. The detecting device according to claim 5, wherein the number of the needles is substantially larger than that of the first pads, and each of the first pads is substantially coupled to more than one needle individually.

7. The detecting device according to claim 6, wherein each of the first transition points is substantially coupled to more than one needle individually.

8. A detecting device for detecting the electrical connection between a plurality of first pads and second pads of a package substrate, wherein the first pads and the second pads are disposed on two opposite sides of the package substrate, comprising:
    a first socket unit, disposed on and coupled to the first pads;
    a plurality of first detecting components, disposed on and coupled to the first socket unit, the first detecting components and the package substrate are disposed on two opposite sides of the first socket unit;
    a second socket unit disposed under and coupled to the second pads;
    a plurality of second detecting components disposed under and coupled to the second socket unit, wherein the second detecting components and the package substrate are disposed on two opposite sides of the second socket unit;
    wherein while detecting, the first detecting components, the first socket unit, the first pads, the second pads, the second socket unit and the second detecting components are electrically connected sequentially, so as to determine whether the first pads are respectively and electrically connected to the second pads.

9. The detecting device according to claim 8, wherein the first socket unit comprises:
    a first conductive piece, coupled to the first pads; and
    a first socket component, having a first transition surface and a second transition surface;
    wherein the first transition surface is coupled to the first detecting components, and the second transition surface is coupled to the first conductive pieces.

10. The detecting device according to claim 9, wherein the first transition surface has a plurality of first transition points disposed towards the first detecting components, and the second transition surface has a plurality of second transition points disposed towards the first pads.

11. The detecting device according to claim 10, wherein the first transition points are respectively and electrically connected to the second transition points.

12. The detecting device according to claim 11, wherein the first conductive piece comprises:
    a plurality of first needles, disposed substantially parallel to each other.

13. The detecting device according to claim 12, wherein the number of the first needles is substantially larger than that of the first pads, and each of the first pads is substantially corresponding to and coupled to more than one first needle.

14. The detecting device according to claim 13, wherein each of the first transition points is substantially coupled to more than one first needle individually.

15. The detecting device according to claim 8, wherein the second socket unit comprises:
    a second conductive piece, coupled to the second pads; and
    a second socket component, having a third transition surface and a fourth transition surface;
    wherein the third transition surface is coupled to the second conductive pieces, and the fourth transition surface is coupled to the second detecting components.

16. The detecting device according to claim 15, wherein the third transition surface has a plurality of third transition points disposed towards the second pads, and the fourth transition surface has a plurality of fourth transition points disposed towards the second detecting components.

17. The detecting device according to claim 16, wherein the third transition points are respectively and electrically connected to the fourth transition points.

18. The detecting device according to claim 17, wherein the second conductive piece comprises:
    a plurality of second needles, disposed substantially parallel to each other.

19. The detecting device according to claim 18, wherein the number of the second needles is substantially larger than that of the second pads, and each of the second pads is substantially corresponding to and coupled to more than one second needle.

20. The detecting device according to claim 19, wherein each of the third transition points is substantially coupled to more than one second needle individually.

* * * * *